(12) United States Patent
Kawamori et al.

(10) Patent No.: US 10,629,457 B2
(45) Date of Patent: Apr. 21, 2020

(54) METHOD FOR MANUFACTURING SEMICONDUCTOR DEVICE

(71) Applicant: HITACHI CHEMICAL COMPANY, LTD., Tokyo (JP)

(72) Inventors: Takashi Kawamori, Tsukuba (JP); Naoya Suzuki, Tsukuba (JP)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 0 days.

(21) Appl. No.: 14/405,961

(22) PCT Filed: Jun. 5, 2013

(86) PCT No.: PCT/JP2013/065590
§ 371 (c)(1),
(2) Date: Dec. 5, 2014

(87) PCT Pub. No.: WO2013/183671
PCT Pub. Date: Dec. 12, 2013

(65) Prior Publication Data
US 2015/0118792 A1    Apr. 30, 2015

(30) Foreign Application Priority Data
Jun. 8, 2012   (JP) .................................. 2012-131066

(51) Int. Cl.
H01L 21/56    (2006.01)
H01L 23/31    (2006.01)
(Continued)

(52) U.S. Cl.
CPC .......... H01L 21/566 (2013.01); H01L 21/561 (2013.01); H01L 21/565 (2013.01);
(Continued)

(58) Field of Classification Search
CPC ..... H01L 23/552; H01L 23/60; H01L 21/566; H01L 2225/06537; H01L 21/565
See application file for complete search history.

(56) References Cited

U.S. PATENT DOCUMENTS 4,307,147 A * 12/1981 Ohishi ................ H01L 23/3737
257/E23.107
4,326,238 A *  4/1982 Takeda .................. H01L 23/295
174/16.3
(Continued)

FOREIGN PATENT DOCUMENTS

CN    102082103 A    6/2011
JP    06-275742 A    9/1994
(Continued)

OTHER PUBLICATIONS http://nptel.ac.in/courses/112107085/module4/lecture4/lecture4.pdf.*

(Continued)

Primary Examiner — David A Zarneke
(74) Attorney, Agent, or Firm — Fitch, Even, Tabin & Flannery, L.L.P.

(57) ABSTRACT

Provided is a method for manufacturing a semiconductor device through which improvement of production efficiency can be achieved. In the method of manufacturing the semiconductor device (1), a sealing material (7) is attached to seal a semiconductor element (3), a release film (F) is provided in a mold facing the semiconductor element (3), and the sealing material (7) is cured by an upper mold (22) and a lower mold (24). A metal layer (9) that shields electromagnetic waves is previously provided on a side of the release film (F) coming in contact with the sealing material (7). In the curing of the sealing material (7), the metal layer (9) is transferred to the sealing material (7).

7 Claims, 9 Drawing Sheets

(51) Int. Cl.
*H01L 25/065* (2006.01)
*H01L 23/552* (2006.01)
*H05K 3/28* (2006.01)
*H01L 23/60* (2006.01)
*H01L 23/00* (2006.01)

(52) U.S. Cl.
CPC ........ *H01L 23/3121* (2013.01); *H01L 23/552* (2013.01); *H01L 23/60* (2013.01); *H01L 25/0652* (2013.01); *H05K 3/284* (2013.01); H01L 24/16 (2013.01); H01L 24/32 (2013.01); H01L 24/48 (2013.01); H01L 25/0655 (2013.01); H01L 2224/16225 (2013.01); H01L 2224/32145 (2013.01); H01L 2224/32225 (2013.01); H01L 2224/48227 (2013.01); H01L 2924/00014 (2013.01); H01L 2924/181 (2013.01); H01L 2924/3025 (2013.01); H05K 2201/0715 (2013.01); H05K 2203/1316 (2013.01)

(56) References Cited

U.S. PATENT DOCUMENTS

| | | | | |
|---|---|---|---|---|
| 4,994,903 | A * | 2/1991 | Wroe | H01L 23/3733 257/720 |
| 5,057,903 | A * | 10/1991 | Olla | H01L 23/367 257/707 |
| 6,951,776 | B2 * | 10/2005 | Lo | H01L 21/561 257/E21.504 |
| 7,064,429 | B2 * | 6/2006 | Bemmerl | H01L 21/563 257/706 |
| 7,470,977 | B2 * | 12/2008 | Okubora | H01L 23/04 257/659 |
| 7,700,411 | B2 * | 4/2010 | Yang | H01L 23/3121 257/659 |
| 7,701,040 | B2 * | 4/2010 | Huang | H01L 21/561 257/659 |
| 8,012,799 | B1 | 9/2011 | Ibrahim et al. | |
| 8,062,930 | B1 * | 11/2011 | Shah | C23C 4/06 438/110 |
| 9,159,716 | B2 * | 10/2015 | Hsu | H01L 25/0657 |
| 9,337,153 | B2 * | 5/2016 | Fu | H01L 23/552 |
| 9,953,929 | B2 * | 4/2018 | Dias | H01L 21/561 |
| 2005/0077615 | A1 * | 4/2005 | Yu | H01L 23/367 257/706 |
| 2005/0127484 | A1 * | 6/2005 | Wills | H01L 23/36 257/678 |
| 2006/0208365 | A1 * | 9/2006 | Shen | H01L 21/563 257/778 |
| 2007/0121327 | A1 * | 5/2007 | Chen | H01L 33/641 362/294 |
| 2007/0216021 | A1 | 9/2007 | Morita et al. | |
| 2009/0294928 | A1 * | 12/2009 | Kim | H01L 21/561 257/659 |
| 2011/0115060 | A1 * | 5/2011 | Chiu | H01L 21/568 257/660 |
| 2011/0233736 | A1 * | 9/2011 | Park | H01L 25/105 257/659 |
| 2012/0018858 | A1 * | 1/2012 | Chen | H01L 21/565 257/659 |
| 2012/0243191 | A1 * | 9/2012 | Wu | H05K 1/0218 361/760 |
| 2012/0243199 | A1 * | 9/2012 | Wu | H01L 23/552 361/818 |
| 2014/0346686 | A1 * | 11/2014 | Peng | H01L 23/544 257/787 |
| 2015/0118792 | A1 * | 4/2015 | Kawamori | H01L 23/60 438/107 |
| 2016/0133579 | A1 * | 5/2016 | Akiba | H01L 23/552 257/659 |
| 2017/0110383 | A1 * | 4/2017 | Huang | H01L 23/49827 |

FOREIGN PATENT DOCUMENTS

| | | | |
|---|---|---|---|
| JP | H08-250533 | A | 9/1996 |
| JP | 2005-268565 | A | 9/2005 |
| JP | 2007-287937 | A | 11/2007 |
| JP | 4133637 | B2 | 8/2008 |
| JP | 2010-114256 | A | 5/2010 |
| JP | 2010-123839 | A | 6/2010 |
| WO | WO 2013029273 | A1 * | 3/2013 ........... H01L 23/544 |

OTHER PUBLICATIONS

PCT International Preliminary Report on Patentability, dated Dec. 9, 2014, for International (PCT) No. PCT/JP2013/065590.
PCT International Search Report, dated Aug. 13, 2013, for International (PCT) No. PCT/JP2014/065590.
Office Action dated Sep. 26, 2016, for Chinese Application No. 201380041840.6.
Office Action dated Nov. 11, 2016, for Taiwanese Application No. 102120422.
Partial translation of Chen Haitao & Cui Chundang, "Questions and Answers of Practical Techniques for Plastic Mold Operators", 2008.
Partial translation of Dang Genmao, Luo Zhibin et al., "Mold Design and Manufacture", 1995.
English language machine translation of JP 2010-114256 to Yamada.
Machine translation of JP 2007-287937.

* cited by examiner

METHOD FOR MANUFACTURING SEMICONDUCTOR DEVICE

TECHNICAL FIELD

The present invention relates to a method for manufacturing a semiconductor device.

BACKGROUND ART

In recent years, in response to demands on a miniaturization of electronic devices, an improvement of mounting semiconductor elements on a surface at a high density is required further more. Therefore, in recent years, a so-called stack package type of semiconductor device is employed in which a plurality of semiconductor elements are stacked in multiple stages. In such a stack package type of semiconductor device, since the stacked semiconductor elements are arranged, there may be caused a problem of external noises (electromagnetic interference). Such a noise problem becomes remarkable as the electronic devices are digitalized, increase in speed, and operate in higher frequencies. Then, in order to suppress a noise influence, an electromagnetic wave shielding sheet to shield electromagnetic waves is formed on a sealing material which seals the semiconductor elements (for example, see Patent Literature 1).

As the formation of the electromagnetic wave shielding sheet, for example, there is a known method for manufacturing the semiconductor device disclosed in Patent Literature 2. In the method for manufacturing the semiconductor device disclosed in Patent Literature 2, in a process of sealing the semiconductor element with the sealing material through a transfer molding method using an upper mold and a lower mold, an electromagnetic wave shielding resin is coated on a release film (carrier film) disposed in the upper mold, and the electromagnetic wave shielding resin is transferred to the sealing material and cured thereon when the sealing material is formed.

CITATION LIST

Patent Literature

Patent Literature 1: JP 4133637 B1
Patent Literature 2: JP 2007-287937 A

SUMMARY OF INVENTION

Technical Problem

However, in the method disclosed in Patent Literature 2, the electromagnetic wave shielding resin is necessarily coated on the carrier film whenever the sealing material is formed, so that it causes trouble. In the process of manufacturing the semiconductor device, there is required further improvement of production efficiency.

The invention has been made to solve the above problem, and an object thereof is to provide a method for manufacturing a semiconductor device through which improvement of production efficiency can be achieved.

Solution to Problem

According to the invention in order to solve the above problem, there is provided a method for manufacturing a semiconductor device by a compression mold method using a compression mold which includes an upper mold and a lower mold. The method includes attaching a sealing material to seal a semiconductor element, providing a release film in a mold facing the semiconductor element, and curing the sealing material by the upper mold and the lower mold. A shielding material that shields electromagnetic waves is previously provided on a side of the release film coming in contact with the sealing material. The shielding material is transferred to the sealing material in the curing of the sealing material.

In the method for manufacturing the semiconductor device, the shielding material is provided on the release film in advance. The release film is a member which is provided to make the sealing material not come into direct contact with the mold, and is held to the mold facing the semiconductor element when the sealing material is cured. By providing the shielding material on the release film in advance, the shielding material for shielding the electromagnetic waves can be transferred to the sealing material in the process of curing the sealing material by the compression mold. Therefore, unlike the related art, the curing of the sealing material and the formation of the shielding material can be simultaneously performed while omitting the work of coating the shielding material one by one. In addition, the formation of the sealing material and the transfer of the shielding material can be sequentially performed through a compression mold method. Therefore, it is possible to achieve an improvement of production efficiency.

In an embodiment, the shielding material may be provided at a position of the release film corresponding to a mounting position of the semiconductor element. In addition, in an embodiment, a plurality of semiconductor elements may be mounted on a substrate, and the shielding material may be provided on the release film not to be contained in a dicing line which is used when the plurality of semiconductor elements are cut into pieces. With this configuration, the shielding material is not necessarily formed on the entire surface of the sealing material, so that the manufacturing cost can be reduced. In addition, when the sealing material is cut, the metal portion does not come into contact with a cutter, so that it is possible to suppress the occurrence of metal wastes generated at the time of cuffing, and damage on a manufacturing apparatus can be suppressed.

Advantageous Effects of Invention

According to the invention, it is possible to achieve an improvement of production efficiency.

DESCRIPTION OF EMBODIMENTS

Hereinafter, preferred embodiments of the invention will be described in detail with reference to the accompanying drawings. Further, the same or corresponding elements in the description of the drawings will be denoted with the same symbols, and redundant descriptions are not repeated.

Figure 1:
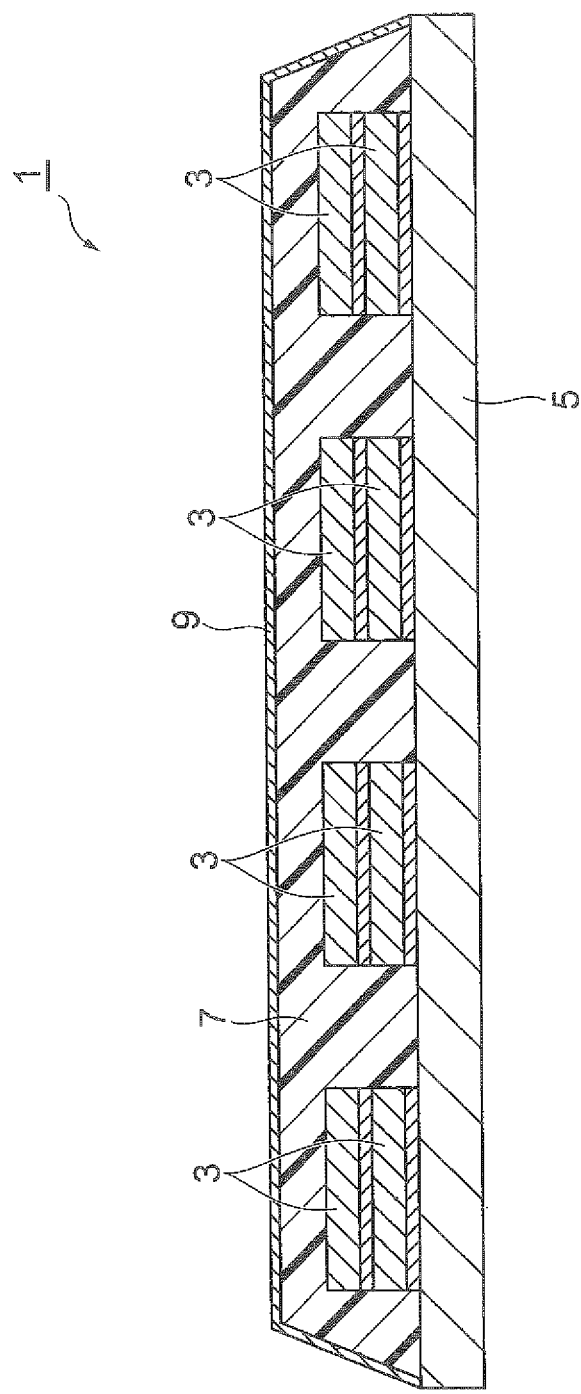
FIG. 1 is a cross-sectional view illustrating a cross-sectional structure of a semiconductor device which is manufactured by a method for manufacturing a semiconductor device according to an embodiment.

FIG. 1 is a cross-sectional view illustrating a cross-sectional structure of a semiconductor device which is manufactured by a method for manufacturing a semiconductor device according to an embodiment. A semiconductor device 1 illustrated in FIG. 1 is a stack package type of semiconductor device in which a plurality of semiconductor chips 3 are stacked in multiple stages. Further, the semiconductor device 1 illustrated in FIG. 1 is in a state before being cut into individual semiconductor devices (package unit).

The semiconductor device 1 is formed such that a plurality of semiconductor chips (semiconductor elements) 3 are mounted on a substrate 5. In addition, the semiconductor chips 3 are stacked in multiple stages. The semiconductor chips 3 and the substrate 5 are electrically connected, and the stacked semiconductor chips 3 and 3 may be not electrically connected to each other. As a method for electrically connecting the semiconductor chips 3 and the substrate 5, and connecting the semiconductor chips 3 and 3, for example, a wire bonding method, a bump connection method, and the like can be used.

The plurality of semiconductor chips 3 are sealed on the substrate 5 by a sealing material 7. The sealing material 7 may be formed using a thermosetting resin, for example, a solid or liquid epoxy-based sealing material. For example, a CEL series (CEL-9740 or the like made by Hitachi Chemical Co., Ltd) may be used as the solid sealing material, and a CEL-C series (CEL-C-2902 or the like made by Hitachi Chemical Co., Ltd) may be used as the liquid sealing material. The sealing material 7 is provided to cover the entire semiconductor chips 3.

On the surface of the sealing material 7, a metal layer (a metal film, a shielding material) 9 is provided. In the embodiment, the metal layer 9 in the semiconductor device 1 is formed on the entire surface of the sealing material 7. The metal layer 9 serves as an electromagnetic wave shielding layer for shielding electromagnetic waves. Further, the shielding described herein means not only a case where the electromagnetic waves are completely shielded but also a case where an influence of noises due to the electromagnetic waves is suppressed. In the metal layer 9, for example, gold, aluminum, nickel, indium, iron, copper, and the like may be used. In addition, it is desirable to use an alloy obtained from the above materials from a viewpoint of preventing hillock formation and migration. The thickness of the metal layer 9, for example, is desirably set to 3 μm or less from a viewpoint of ease film cutting. In addition, the thickness of the metal layer 9 is desirably set to 0.05 μm or more from a viewpoint of a property of shielding the electromagnetic waves.

Figure 2:
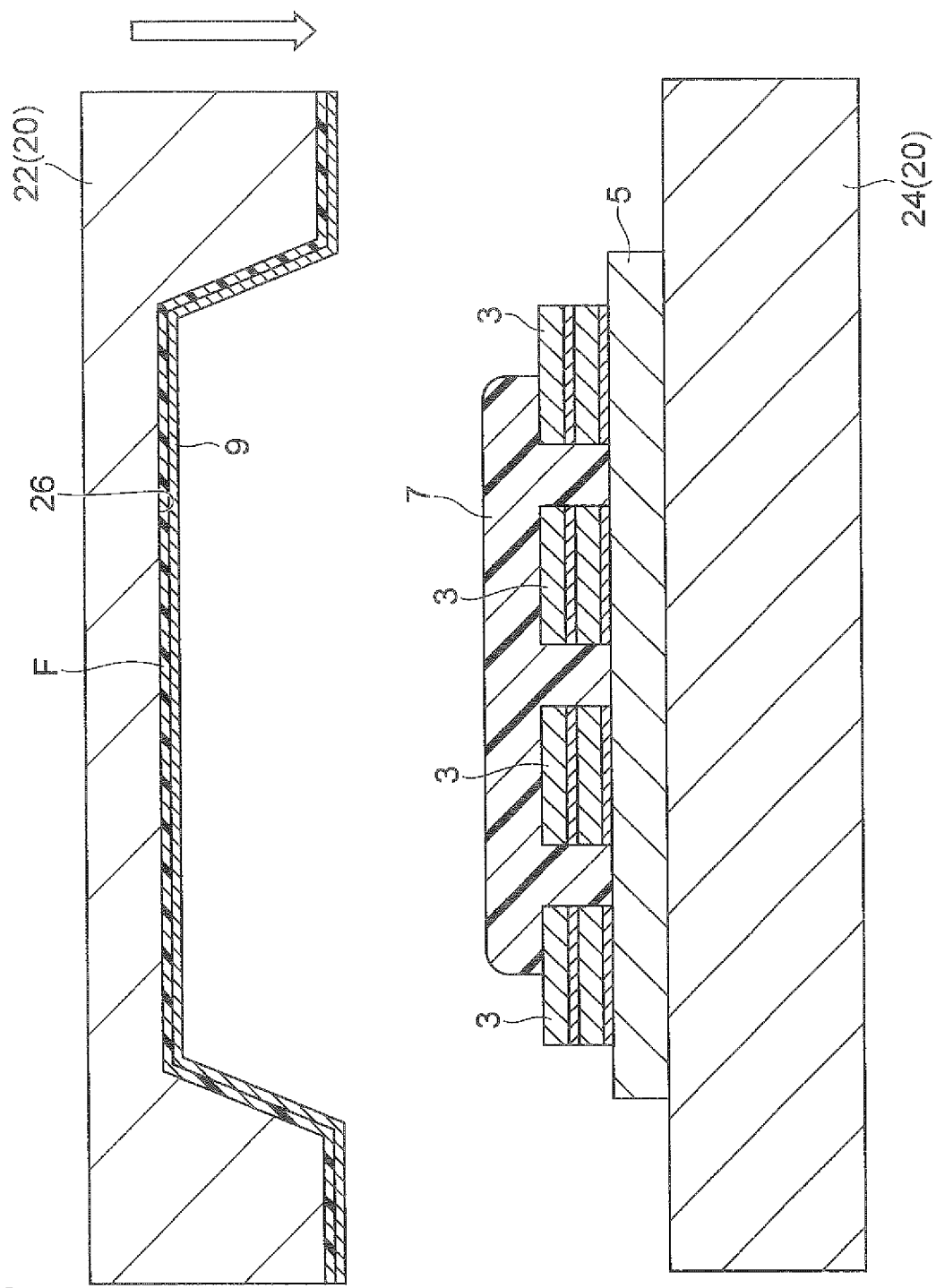
FIG. 2 is a diagram for describing the method for manufacturing the semiconductor device.
Figure 3:
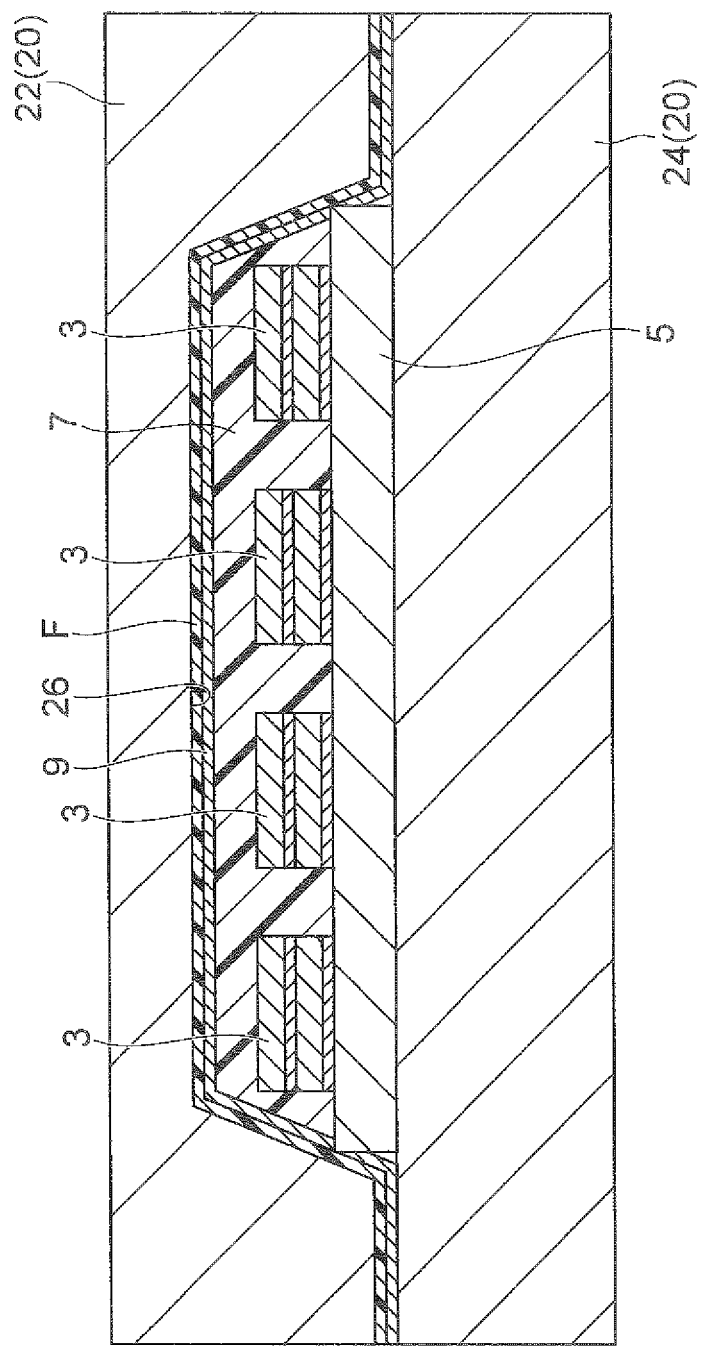
FIG. 3 is a diagram for describing the method for manufacturing the semiconductor device.
Figure 4:
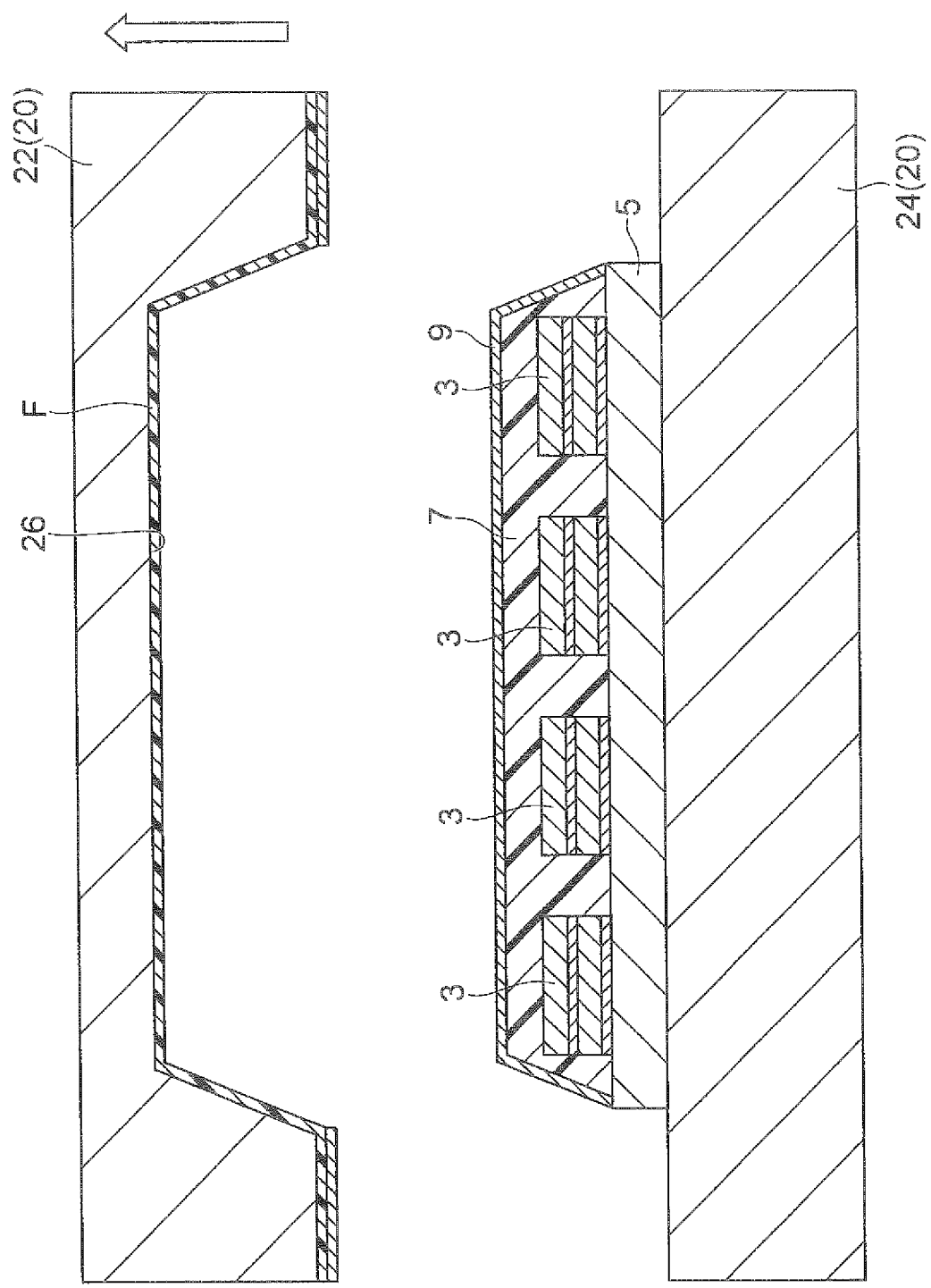
FIG. 4 is a diagram for describing the method for manufacturing the semiconductor device.

Subsequently, the method for manufacturing the above-mentioned semiconductor device 1 will be described with reference to FIGS. 2 to 4. FIGS. 2 to 4 are diagrams for describing the method for manufacturing the semiconductor device. The semiconductor device 1 is manufactured by a compression mold method.

First, a compression mold 20 used in the compression mold method will be described. The compression mold 20 is a mold which is obtained by compressing, heating, and curing the sealing material 7. The compression mold 20 includes an upper mold 22 and a lower mold 24. The lower mold 24 is a portion on which the substrate 5 is placed (disposed), and has a flat surface. The upper mold 22 is a mold which is disposed to face the semiconductor element 3. In the upper mold 22, a concave portion 26 having an almost trapezoidal shape in cross section view is provided. In the upper mold 22 and the lower mold 24, a heater (not illustrated) for thermally curing the sealing material 7 is built therein.

In the concave portion 26 of the upper mold 22, a release film F is provided along the inner surface of the concave portion 26 when the sealing material 7 is cured. In the upper mold 22, a suction mechanism (not illustrated) is provided, and the release film F is adsorbed and held onto the upper mold 22.

The release film F is a member to be interposed between the upper mold 22 and the sealing material 7 to order to make the sealing material 7 not come into direct contact with the upper mold 22. In a state where the release film F is held to the upper mold 22, a surface of the release film F on a side near the sealing material 7 has detachability. Further, the detachability means even a case where the surface has adhesiveness at a degree of adhering and holding the metal layer 9. In addition, the release film F has heat resistance to endure heating of the heater of the compression mold 20. The release film F may be formed in a long shape suspended between a feeding-out reel and a winding-up reel, a film shape cut in a size of almost covering the substrate 5, or a combined shape thereof.

As the release film F, for example, a tetrafluoroethylene hexafluoropropylene copolymer (FEP) film, a glass cloth impregnated with fluorine, a polyethylene telephthalate (PET) film, an ethylene tetrafluoroethylene copolymer (ETFE) film, a polypropylene film, and polyvinylidene chloride may be appropriately used.

Figure 5:
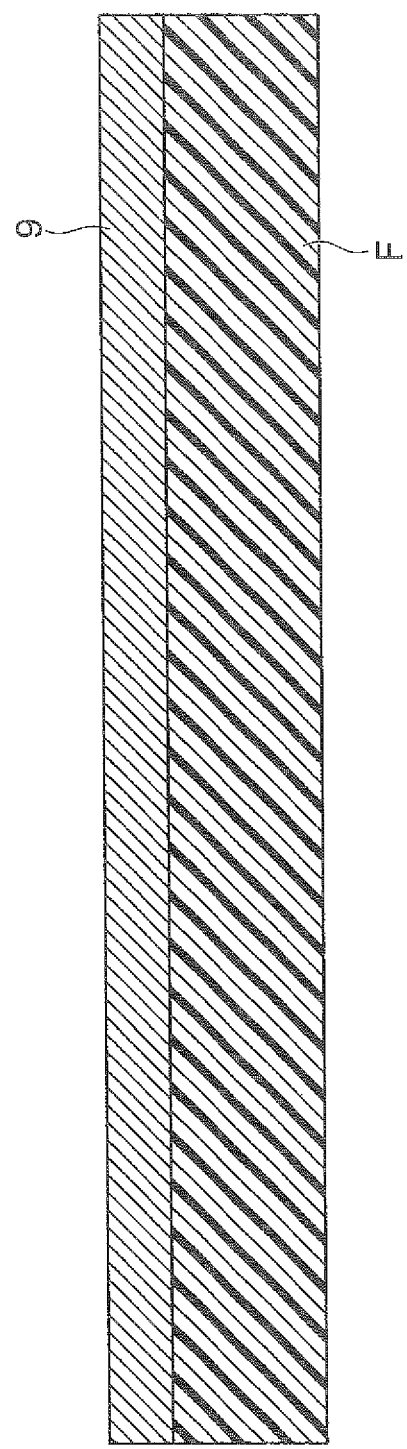
FIG. 5 is a cross-sectional view of a release film on which a metal layer is formed.

As illustrated in FIG. 5, the metal layer 9 is provided on the surface of the release film F in advance. The metal layer 9 is provided on the surface on a side of the release film F coming in contact with the sealing material 7 in a state where the release film F is held to the upper mold 22. The metal layer 9 is formed on the release film F by a deposition method such as a vacuum deposition method, a sputtering method such as a DC sputtering method and an RF sputtering method, an ion plating method, an electroless plating method, or the like. In particular, the deposition method and the sputtering method are desirable from a viewpoint of cost for depositing films and easiness of process.

Subsequently, a sequence of manufacturing the semiconductor device 1 will be described. As illustrated in FIG. 2, first, the substrate 5 having the semiconductor chip 3 mounted thereon is disposed on the lower mold 24. Next, the pasty sealing material 7 before curing is attached onto the substrate 5, for example, by potting. At this time, the release film F is adsorbed and held to the upper mold 22.

Subsequently, as illustrated in FIG. 3, the lower mold 24 and the upper mold 22 are stacked together, and the sealing material 7 is compressed and heated. Therefore, the sealing material 7 is cured in a shape along the concave portion 26 of the upper mold 22. Then, after the curing of the sealing material 7, as illustrated in FIG. 4, the upper mold 22 is separated from the lower mold 24. At this time, since the release film F has the detachability and the sealing material 7 has adhesiveness stronger than that of the release film F, the metal layer 9 is separated from the release film F so as to be attached and transferred to the sealing material 7. Therefore, in the process of curing the sealing material 7, the metal layer 9 can be formed on the surface of the sealing material 7. In this way, the semiconductor chip 3 mounted on the substrate 5 is sealed.

As described above, in the embodiment, the metal layer 9 is provided on the release film F in advance. The release film F is a material which is provided not to make the sealing material 7 come in direct contact with the upper mold 22. The release film F is held to the upper mold 22 of the compression mold 20 when the sealing material 7 is cured. By providing the metal layer 9 on the release film F in advance, the metal layer 9 for shielding electromagnetic waves can be transferred to the sealing material 7 in the process of curing the sealing material 7 using the compression mold 20. Therefore, it is possible to simultaneously perform the curing of the sealing material 7 and the formation of the metal layer 9. As a result, improvement of production efficiency can be achieved.

In addition, in the embodiment, the formation of the sealing material 7 and the formation of the metal layer 9 can be continuously performed by the compression mold method. Therefore, improvement of the production efficiency of the semiconductor device 1 can be achieved still more.

Figure 6:
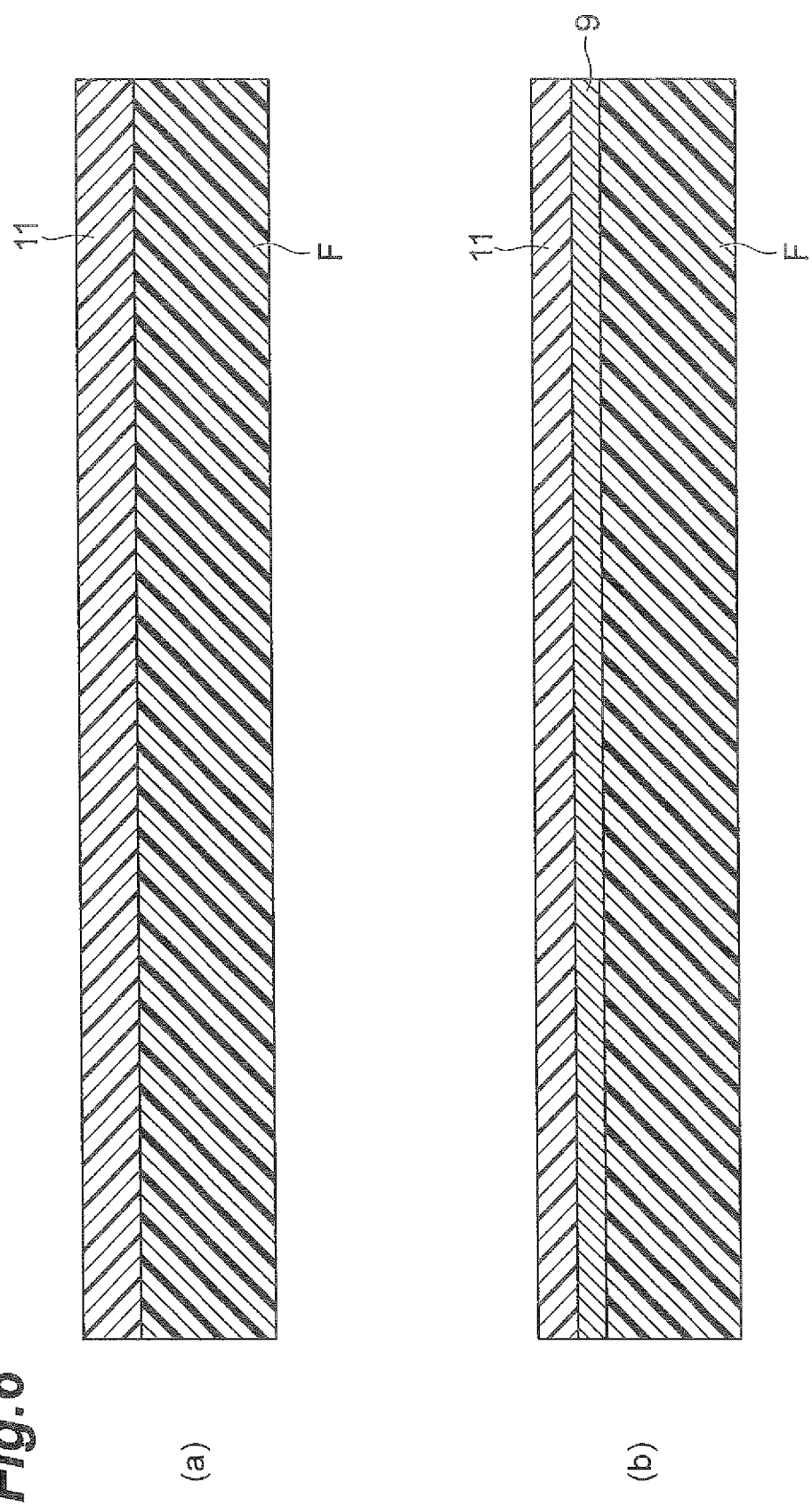
FIG. 6 is a cross-sectional view of the release film on which a shielding material according to another embodiment is formed.

The invention is not limited to the above embodiment. For example, the above embodiment has been described about the configuration in which the metal layer 9 is provided on the release film F. However, any other material besides the metal layer 9 may be used as the shielding material. FIG. 6 is a cross-sectional view of the release film on which the shielding material according to another embodiment is formed.

As illustrated in FIG. 6(a), an organic film 11 may be used as the shielding material. The organic film 11 includes an electromagnetic wave shielding material. As the organic film 11, for example, polyimide, polyamide imide, acrylic rubber, phenoxy resin, epoxy resin, and the like may be used. In addition, ferrite may be used as the electromagnetic wave shielding material. The thickness of the organic film 11 is desirable to be, for example, about 1 µm to 300 µm.

In addition, as illustrated in FIG. 6(b), a stack of the metal layer 9 and the organic film 11 may be used as the shielding material. In the case of such a configuration, the organic film 11 is laminated after the metal layer 9 is formed on the release film F in order to obtain the configuration that the metal layer 9 and the organic film 11 are stacked.

Figure 7:
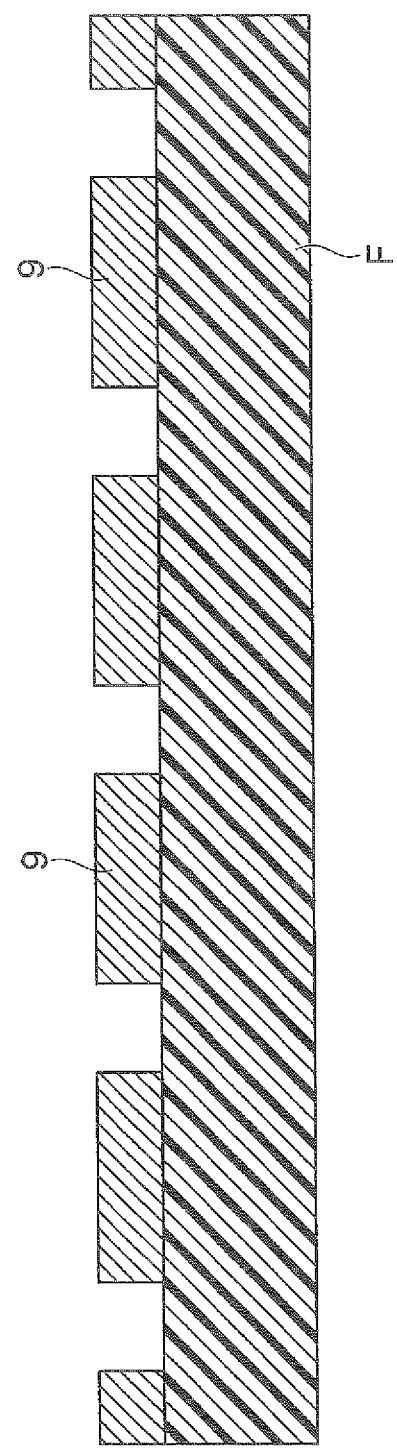
FIG. 7 is a cross-sectional view of the release film on which the shielding material according to another embodiment is formed.
Figure 8:
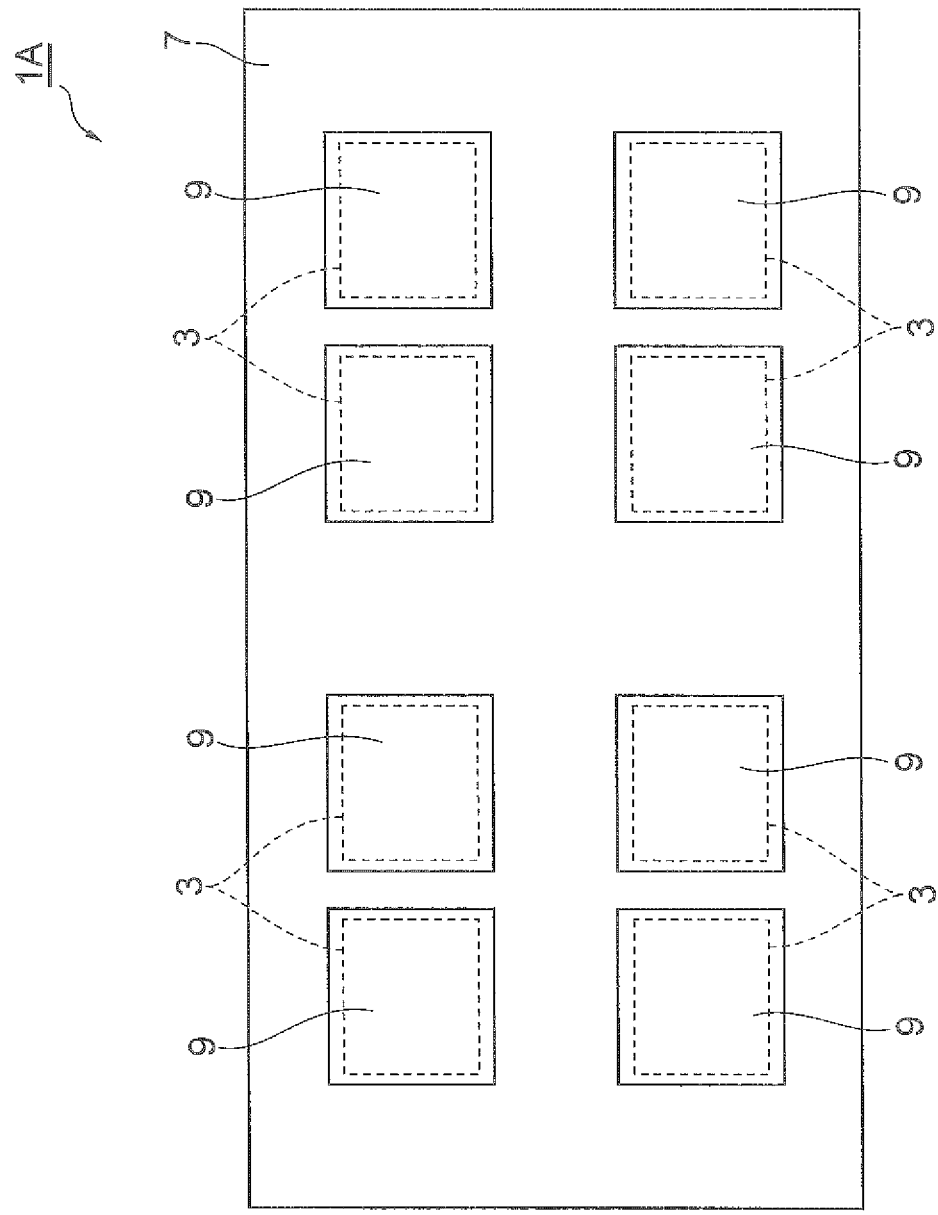
FIG. 8 is a plan view illustrating the semiconductor device to which the shielding material illustrated in FIG. 7 is transferred.

In addition, the metal layer 9 (the organic film 11) provided on the release film F may be formed only at a position corresponding to a mounting position of the semiconductor chip 3. As illustrated in FIG. 7, the metal layer 9 is formed only on a portion corresponding to the mounting position of the semiconductor chip 3. With the release film F on which the metal layer 9 is provided, the metal layer 9 is formed only at a position corresponding to the semiconductor chip 3 in a semiconductor device 1A as illustrated in FIG. 8. In other words, the metal layer 9 may be formed on the entire surface of the sealing material 7, or may be formed according to a plane dimension of the semiconductor chip 3.

In addition, the metal layer 9 may be formed not to be contained in a dicing line used when the semiconductor device 1A is cut into packages. In this way, the configuration of forming the metal layer 9 in a specific place can reduce manufacturing cost compared to a case where the metal layer 9 is formed on the entire surface of the sealing material 7.

Figure 9:
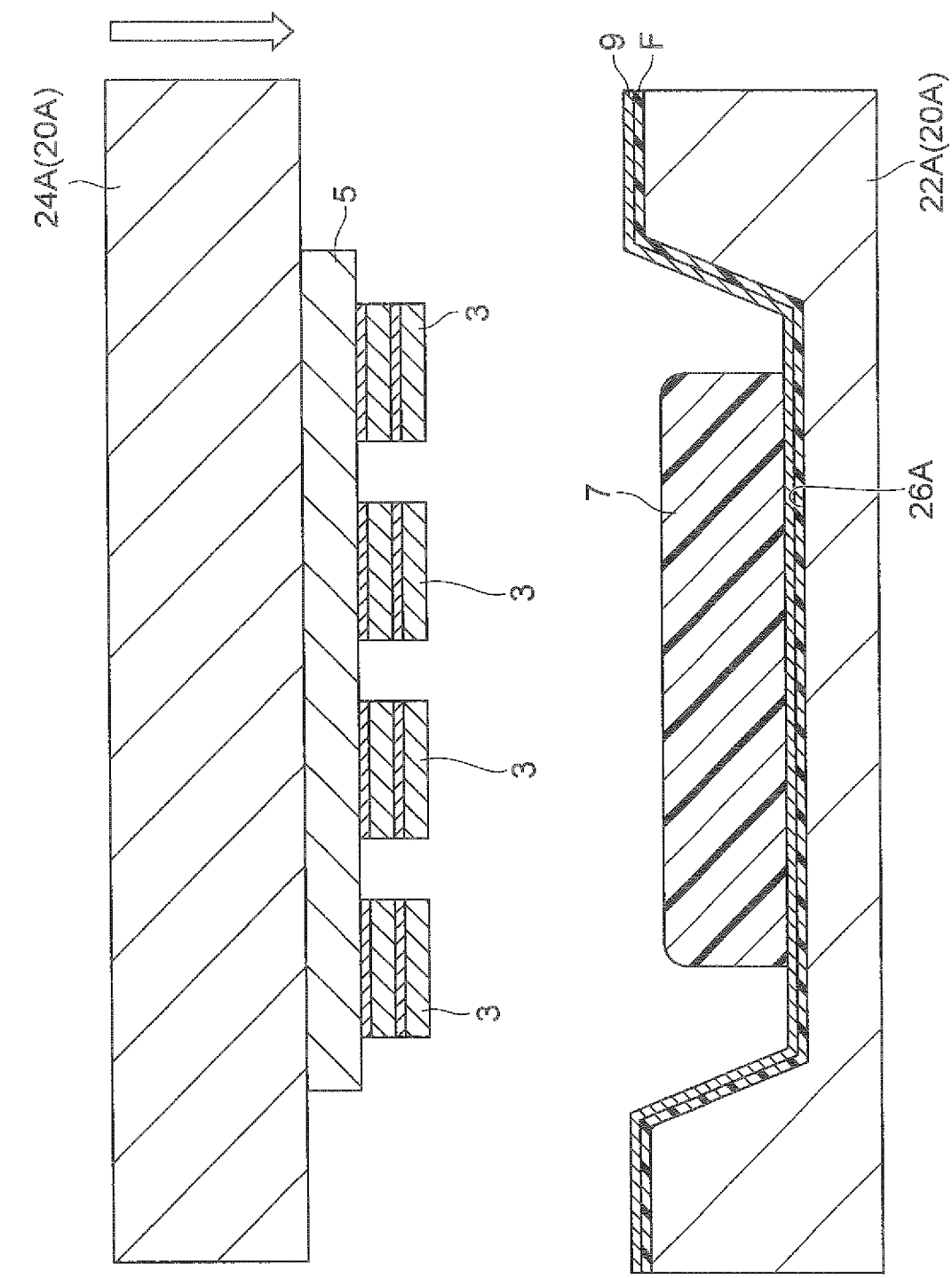
FIG. 9 is a diagram for describing a method for manufacturing the semiconductor device according to another embodiment.

In addition, for example, a compression mold 20A illustrated in FIG. 9 may be used as the compression mold. As illustrated in FIG. 9, the compression mold 20A includes an upper mold 24A and a lower mold 22A. The lower mold 22A is a mold facing the semiconductor element 3. The lower mold 22A is provided with a concave portion 26A of which the cross section is an almost trapezoidal shape. The upper mold 24A is a portion to hold the substrate 5, and has a flat surface. In the upper mold 24A and the lower mold 22A, a heater (not illustrated) is built in to thermally cure the sealing material 7.

The concave portion 26A of the lower mold 22A is provided with the release film F along the inner surface of the concave portion 26A when the sealing material 7 is cured. A sequence of manufacturing the semiconductor device 1 using the compression mold 20A thus configured will be described.

As illustrated in FIG. 9, first, the substrate 5 having the semiconductor chip 3 mounted thereon is held to the upper mold 24A. Next, the pasty sealing material 7 before curing is attached onto the release film F which is adsorbed and held to the lower mold 22A, for example, by potting.

Subsequently, the upper mold 24A and the lower mold 22A are stacked together, and the sealing material 7 is compressed and heated. Therefore, the sealing material 7 is cured in a shape along the concave portion 26A of the lower mold 22A. At this time, the metal layer 9 is separated from the release film F so as to be attached and transferred to the sealing material 7. Therefore, in the process of curing the sealing material 7, the metal layer 9 can be formed on the surface of the sealing material 7. In this way, the semiconductor chip 3 is sealed by the sealing material 7.

REFERENCE SIGNS LIST 1, 1A SEMICONDUCTOR DEVICE
3 SEMICONDUCTOR CHIP (SEMICONDUCTOR ELEMENT)
5 SUBSTRATE
7 SEALING MATERIAL
9 METAL LAYER (SHIELDING MATERIAL)
11 ORGANIC FILM (SHIELDING MATERIAL)
20, 20A COMPRESSION MOLD
22, 24A UPPER MOLD
24, 22A LOWER MOLD
F RELEASE FILM

The invention claimed is:

1. A method for manufacturing a semiconductor device by a compression mold method using a compression mold which includes an upper mold and a lower mold, the method comprising:
attaching a sealing material to seal a semiconductor element;
providing a release film in the upper mold or the lower mold facing the semiconductor element; and
curing the sealing material by the upper mold and the lower mold,
wherein a shielding material that shields electromagnetic waves is provided on the release film before providing the release film in the upper mold or the lower mold, the shielding material being provided on a side of the release film coming in contact with the sealing material, wherein the shielding material comprises a structure in which a metal layer formed by a deposition method or a sputtering method is laminated with an organic film containing an electromagnetic wave shielding composition, and wherein the shielding material is transferred to the sealing material in the curing of the sealing material.

2. The method for manufacturing the semiconductor device according to claim 1, wherein the metal layer is provided at a position of the release film corresponding to a mounting position of the semiconductor element.

3. The method for manufacturing the semiconductor device according to claim 2, wherein a plurality of semiconductor elements are mounted on a substrate, and wherein the metal layer is provided on the release film not to be contained in a dicing line which is used when the plurality of semiconductor elements are cut into pieces.

4. A compression mold method for manufacturing a semiconductor device, the method comprising:

providing a semiconductor element in a compression mold including an upper mold and a lower mold, the semiconductor element being provided on a substrate between the upper mold and the lower mold;

forming a metal layer on a release film using a deposition method or a sputtering method, the metal layer being capable of shielding magnetic waves, and then providing the release film on one of the upper mold or the lower mold with the metal layer facing the other of the upper mold or the lower mold;

laminating an organic film on the metal layer, the organic film containing an electromagnetic wave shielding composition, the metal layer being disposed between the release film and the organic film; and providing a sealing material on the substrate between the upper mold and the lower mold, and then compressing the sealing material around the semiconductor element using the upper mold and the lower mold and curing the sealing material, wherein the organic film and metal layer are transferred to the sealing material in the curing of the sealing material, and the sealing material seals the semiconductor element.

5. The method for manufacturing the semiconductor device according to claim 1, wherein the sealing material is compressed and heated when the upper mold and the lower mold are combined together to cure the sealing material.

6. The method for manufacturing the semiconductor device according to claim 1, wherein the metal layer has a thickness ranging from 0.05 to 3 μm.

7. The method according to claim 4, wherein the metal layer has a thickness ranging from 0.05 to 3 μm.

* * * * *